United States Patent
Takahashi et al.

(10) Patent No.: US 10,965,860 B2
(45) Date of Patent: Mar. 30, 2021

(54) INFORMATION DEVICE, COUPLING DEVICE, INFORMATION SYSTEM, METHOD OF OPERATING INFORMATION DEVICE, AND OPERATION PROGRAM FOR INFORMATION DEVICE

(71) Applicant: FUJIFILM Corporation, Tokyo (JP)

(72) Inventors: Kosuke Takahashi, Saitama (JP); Kazuki Ishida, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 131 days.

(21) Appl. No.: 16/446,524

(22) Filed: Jun. 19, 2019

(65) Prior Publication Data

US 2019/0306403 A1    Oct. 3, 2019

Related U.S. Application Data

(63) Continuation of application No. PCT/JP2017/039998, filed on Nov. 6, 2017.

(30) Foreign Application Priority Data

Dec. 26, 2016 (JP) .............................. JP2016-250644

(51) Int. Cl.
| | | |
|---|---|---|
| *G01R 27/02* | (2006.01) | |
| *H04N 5/232* | (2006.01) | |
| *H04N 17/00* | (2006.01) | |
| *H04N 5/225* | (2006.01) | |
| *G03B 17/56* | (2021.01) | |

(Continued)

(52) U.S. Cl.
CPC ......... *H04N 5/23209* (2013.01); *G01R 27/02* (2013.01); *G03B 13/02* (2013.01);
(Continued)

(58) Field of Classification Search
CPC .................................................. G01R 27/02
See application file for complete search history.

(56) References Cited

U.S. PATENT DOCUMENTS 5,323,139 A * 6/1994 Isaki ................... G11B 33/027
340/426.34
6,352,378 B1   3/2002 Izukawa
(Continued)

FOREIGN PATENT DOCUMENTS

JP    59-126522 A    7/1984
JP     7-234432 A    9/1995
(Continued)

OTHER PUBLICATIONS

International Preliminary Report on Patentability and Written Opinion of the International Searching Authority, dated Jul. 11, 2019, for International Application No. PCT/JP2017/039998, with an English translation of the Written Opinion of the International Searching Authority.

(Continued)

*Primary Examiner* — Walter L Lindsay, Jr.
*Assistant Examiner* — Milton Gonzalez
(74) *Attorney, Agent, or Firm* — Birch, Stewart, Kolasch & Birch, LLP

(57) ABSTRACT

A coupling device 20 includes a first resistive element 22, and a single-pole single-throw switch 21 that is controlled by a digital camera 10 to, in a coupled state in which the digital camera 10 is coupled to an accessory 30, switch an electrical connection state of the first resistive element 22 and a second resistive element 31 included in the accessory 30 to a resistance detection terminal D2 of the digital camera 10 between a first connection state in which the second resistive element 31 is connected to the resistance detection terminal D2 and a second connection state in which the first resistive element 22 and the second resistive element 31 are connected to the resistance detection terminal D2.

19 Claims, 4 Drawing Sheets

(51) Int. Cl.
G03B 17/14 (2021.01)
G03B 15/05 (2021.01)
G03B 13/02 (2021.01)

(52) U.S. Cl.
CPC ............ *G03B 15/05* (2013.01); *G03B 17/14* (2013.01); *G03B 17/56* (2013.01); *H04N 5/225* (2013.01); *H04N 5/23241* (2013.01); *H04N 17/004* (2013.01)

(56) References Cited

U.S. PATENT DOCUMENTS

| | | | |
|---|---|---|---|
| 7,886,104 B2* | 2/2011 | Lai | G06F 13/385 |
| | | | 710/301 |
| 7,958,297 B2* | 6/2011 | Aoki | G06K 19/07741 |
| | | | 710/301 |
| 2013/0272692 A1 | 10/2013 | Kim et al. | |

FOREIGN PATENT DOCUMENTS

| JP | 2001-34327 A | 2/2001 |
|---|---|---|
| JP | 2001-255578 A | 9/2001 |
| JP | 2010-261984 A | 11/2010 |
| JP | 2015-184660 A | 10/2015 |
| KR | 10-2006-0104064 A | 10/2006 |

OTHER PUBLICATIONS

International Search Report, dated Jan. 16, 2018, for International Application No. PCT/JP2017/039998, with an English translation.

\* cited by examiner

INFORMATION DEVICE, COUPLING DEVICE, INFORMATION SYSTEM, METHOD OF OPERATING INFORMATION DEVICE, AND OPERATION PROGRAM FOR INFORMATION DEVICE

CROSS REFERENCE TO RELATED APPLICATIONS

This application is a Continuation of PCT International Application No. PCT/JP2017/039998 filed on Nov. 6, 2017, which claims priority under 35 U.S.C § 119(a) to Patent Application No. 2016-250644 filed in Japan on Dec. 26, 2016, all of which are hereby expressly incorporated by reference into the present application.

BACKGROUND OF THE INVENTION

1. Field of the Invention

The present invention relates to an information device, a coupling device, an information system, a method of operating an information device, and a non-transitory computer readable recording medium storing an operation program for an information device.

2. Description of the Related Art

Imaging apparatuses, such as a digital camera, include an imaging apparatus with attachable and detachable accessories for expanding the functions of the digital camera, such as an interchangeable lens, an electric viewfinder (EVF), a light emission device, such as a flash, a global positioning system (GPS) receiver, an exposure meter, and a wireless release. In an imaging apparatus to which such accessories are attachable, the type of an attached accessory is determined in order to control the accessory.

JP2010-261984A describes a system having a digital camera, an interchangeable lens attachable to the digital camera, and an intermediate accessory as a coupling device that is interposed between the digital camera and the interchangeable lens to couple the digital camera and the interchangeable lens. In the system, in a case where power is supplied from the digital camera to the intermediate accessory and the interchangeable lens, a microcomputer of the intermediate accessory transmits information relating to the type of the intermediate accessory to the interchangeable lens, and the interchangeable lens corrects information to be transmitted to the digital camera based on information transmitted from the microcomputer of the intermediate accessory.

JP1995-234432A (JP-H07-234432A) describes a system having a digital camera, an interchangeable lens attachable to the digital camera, and a mount adapter as a coupling device that is interposed between the digital camera and the interchangeable lens to couple the digital camera and the interchangeable lens. In the system, a microcomputer of the interchangeable lens measures a resistance value of an internal resistive element of the mount adapter, thereby determining the type of the mount adapter.

JP2001-255578A describes a system having a digital camera and a conversion lens attachable to the digital camera. In the system, a microcomputer of the digital camera measures a resistance value of an internal resistive element of the conversion lens, thereby determining the type of the conversion lens.

SUMMARY OF THE INVENTION

As described in JP2010-261984A, in a case where the microcomputer is embedded in the coupling device, it is possible to notify the interchangeable lens or the digital camera of information relating to the type of the coupling device using the microcomputer. However, in a case where the microcomputer is embedded in the coupling device, the cost of the coupling device increases or the size of the coupling device increases. In a case where a coupling device embedded with no microcomputer is attached to the digital camera, it is not possible to determine the type of the coupling device.

As described in JP1995-234432A (JP-H07-234432A), according to the configuration in which information relating to the type of the coupling device is acquired by the microcomputer of the accessory, it is possible to determine the type of a coupling device embedded with no microcomputer. However, in a case where an accessory embedded with no microcomputer is attached to the coupling device, it is not possible to determine the types of the accessory and the coupling device.

As described in JP2001-255578A, in a case where a technique for measuring the resistance value of the accessory or the coupling device on the digital camera side is employed, it is possible to determine the type of an accessory or a coupling device mounted with no microcomputer.

In a case where terminals for type determination are provided individually for the coupling device and the accessory on the digital camera side, even in a state in which the coupling device is attached to the digital camera and the accessory is attached to the coupling device, it is possible to individually measure the resistance value of the coupling device and the resistance value of the accessory. However, in this configuration, the number of terminals of the digital camera increases.

Accordingly, it is preferable that a common terminal for type determination is provided for the coupling device and the accessory on the digital camera side. In this configuration, in a state in which the coupling device is attached to the digital camera and the accessory is attached to the coupling device, a combined resistance value of the resistance value of the coupling device and the resistance value of the accessory is measured by the digital camera, and a combination of the type of the coupling device and the type of the accessory is determined based on the combined resistance value.

However, since the number of combinations of the coupling devices and the accessories is innumerable, the combined resistance values to be measured may be the same regardless of different combinations of the coupling devices and the accessories. The resistance values to be detected may be the same in a case where only the accessory is attached to the digital camera and in a case where the coupling device and the accessory are attached to the digital camera. Accordingly, it may not be possible to accurately determine the type of the coupling device, the type of the accessory, the presence or absence of attachment of the coupling device, or the like.

In order to restrain such erroneous determination, there is a need to design the resistance value of the coupling device and the resistance values of the accessories such that there are no combinations in which the combined resistance values are the same. However, since there is a limit to the detection resolution of the resistance value of the digital camera, it is difficult to restrain combinations in which the combined resistance values are the same. Although it is possible to restrain combinations, in which the combined resistance values are the same, within the range of the detection resolution of the resistance value, in this case, combination patterns of the coupling devices and the accessories are limited, and the expandability of the digital camera is degraded.

Although the digital camera has been heretofore described as an example, even in other information devices (a smartphone, a tablet terminal, and the like) to which an accessory is attachable, in a case where there is a coupling device that couples the accessory and the information device, the same problem occurs.

The invention has been accomplished in consideration of the above-described situation, and an object of the invention is to provide an information device capable of accurately determining the type of an accessory attached to the information device and the type of a coupling device coupling the accessory and the information device without degrading expandability of the information device, a coupling device attachable to the information device, an information system including the information device and the coupling device, a method of operating an information device, and a non-transitory computer readable recording medium storing an operation program for an information device.

The invention provides a coupling device that couples an information device and an accessory of the information device to electrically connect the information device and the accessory. The coupling device comprises a first resistive element, and a switching element that is controlled by the information device to, in a coupled state in which the information device is coupled to the accessory, switch an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal.

The invention provides an information device, to which a coupling device with an attachable and detachable accessory is attachable and which is electrically connected to the accessory attached to the coupling device through the coupling device. The coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal. The information device comprises the resistance detection terminal, a terminal that outputs a control signal for controlling the switching element of the coupling device, and a resistance measurement unit that measures a resistance value of a resistive element electrically connected to the resistance detection terminal. The resistance measurement unit supplies the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measures a resistance value of the first resistive element based on the first resistance value and the second resistance value.

The invention provides an information system comprising a coupling device with an attachable and detachable accessory, and an information device to which the coupling device is attachable and that is electrically connected to the accessory attached to the coupling device through the coupling device. The coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal. The information device comprises the resistance detection terminal, a terminal that outputs a control signal for controlling the switching element, and a resistance measurement unit that measures a resistance value of a resistive element electrically connected to the resistance detection terminal. The resistance measurement unit supplies the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measures a resistance value of the first resistive element based on the first resistance value and the second resistance value.

The invention provides a method of operating an information device, to which a coupling device with an attachable and detachable accessory is attachable and which is electrically connected to the accessory attached to the coupling device through the coupling device. The coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal. The information device comprises the resistance detection terminal, and a terminal that outputs a control signal for controlling the switching element of the coupling device. The method comprises a resistance measurement step of supplying the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measuring a resistance value of the first resistive element based on the first resistance value and the second resistance value.

The invention provides a non-transitory computer readable recording medium storing an operation program for an information device, to which a coupling device with an attachable and detachable accessory is attachable and which is electrically connected to the accessory attached to the coupling device through the coupling device. The coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal. The information device comprises the resistance detection terminal, and a terminal that outputs a control signal for controlling the switching element of the coupling device. The operation program causes a computer to execute a resistance measurement step of supplying the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measuring a resistance value of the first resistive element based on the first resistance value and the second resistance value.

According to the invention, it is possible to provide an information device capable of accurately determining the type of an accessory attached to the information device and the type of a coupling device coupling the accessory and the information device without degrading expandability of the information device, a coupling device attachable to the information device, an information system including the information device and the coupling device, a method of operating an information device, and an operation program for an information device.

DESCRIPTION OF THE PREFERRED EMBODIMENTS

Figure 1:
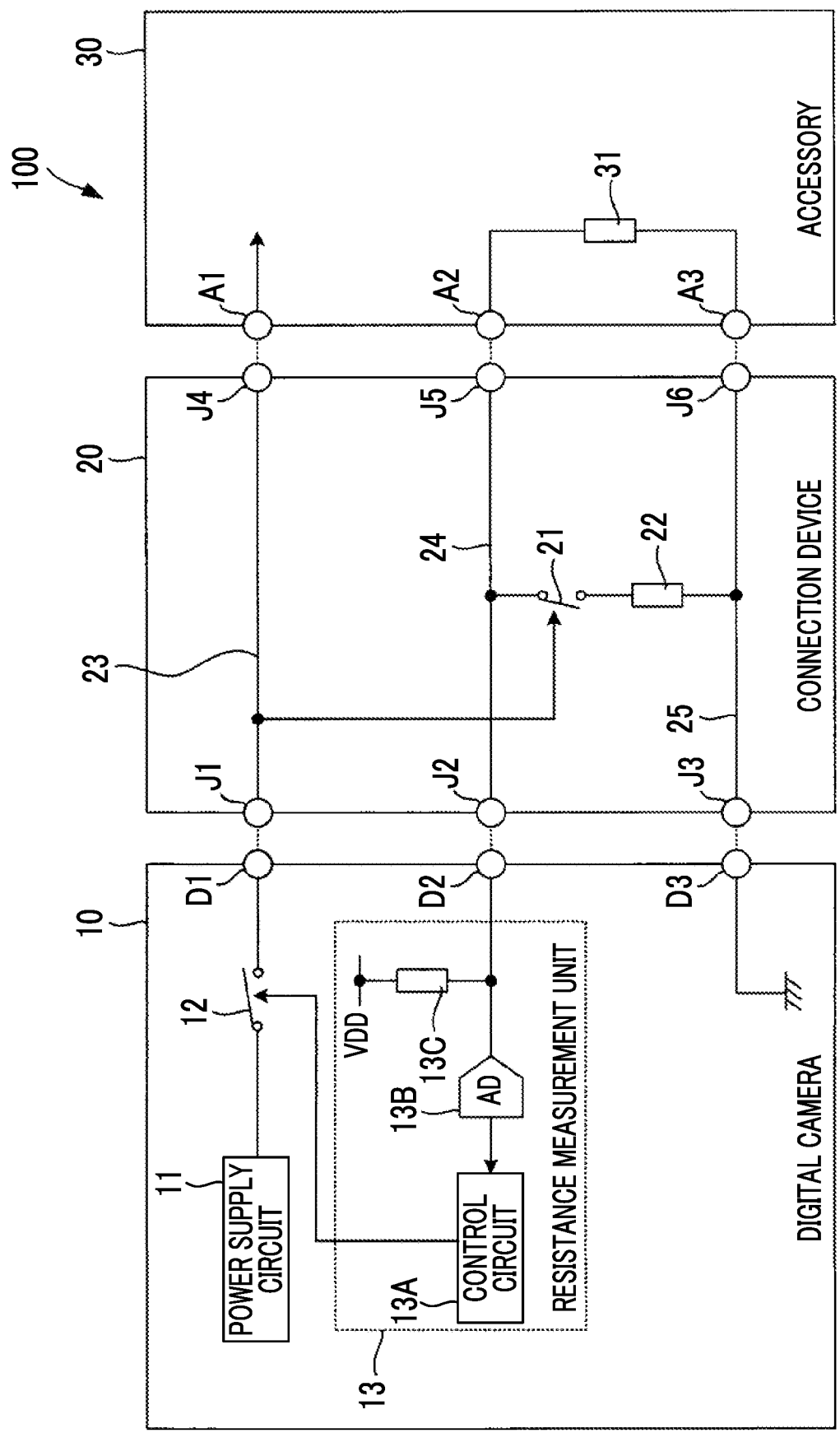
FIG. 1 is a schematic view showing the schematic configuration of a camera system 100 that is an embodiment of an information system of the invention.

FIG. 1 is a schematic view showing the schematic configuration of a camera system 100 that is an embodiment of an information system of the invention.

The camera system 100 comprises a digital camera 10 that constitutes the information device, and a coupling device 20 that couples an accessory 30 for expanding the function of the digital camera 10 and the digital camera 10 to electrically connect the digital camera 10 and the accessory 30.

The accessory 30 is constituted to be attachable to and detachable from the digital camera 10 or the coupling device 20, and is constituted of, for example, an interchangeable lens, an EVF, a light emission device, such as a flash, a GPS receiver, an exposure meter, a wireless release, and the like.

The accessory 30 comprises a terminal A1, a terminal A2, and a terminal A3 for making electrical connection to the digital camera 10 or the coupling device 20, and a second resistive element 31 that is connected between the terminal A2 and the terminal A3, and is constituted of a resistor having a fixed resistance value.

In a state in which the accessory 30 is attached to the coupling device 20, the terminal A1 is electrically connected to a terminal J4 of the coupling device 20, the terminal A2 is electrically connected to a terminal J5 of the coupling device 20, and the terminal A3 is electrically connected to a terminal J6 of the coupling device 20.

The coupling device 20 is constituted to be attachable and detachable to and from the digital camera 10 and to make the accessory 30 attachable and detachable, and is constituted of, for example, a mount adapter, an adapter for changing a tilt angle of the EVF, an adapter for adjusting the distance between the digital camera 10 and the accessory 30, or the like.

The coupling device 20 comprises a terminal J1, a terminal J2, and a terminal J3 that are provided for electrical connection to the digital camera 10, the terminal J4, the terminal J5, and the terminal J6 that are provided for electrical connection to the accessory 30, a single-pole single-throw switch 21 that functions as a switching element, a first resistive element 22 that is constituted of a resistor having a fixed resistance value, a wiring 23 that connects the terminal J1 and the terminal J4, a wiring 24 that connects the terminal J2 and the terminal J5, and a wiring 25 that connects the terminal J3 and the terminal J6.

In a state in which the coupling device 20 is attached to the digital camera 10, the terminal J1 is electrically connected to a voltage supply terminal D1 of the digital camera 10, the terminal J2 is electrically connected to a resistance detection terminal D2 of the digital camera 10, and the terminal J3 is electrically connected to a ground terminal D3 of the digital camera 10.

The wiring 23 of the coupling device 20 functions as a wiring that provides electrical conduction between the voltage supply terminal D1 of the digital camera 10 and the terminal A1 of the accessory 30 in a coupled state in which the coupling device 20 couples the digital camera 10 and the accessory 30.

The single-pole single-throw switch 21 is constituted of, for example, a transistor as a switching element. One end of the single-pole single-throw switch 21 is connected to the wiring 24, and the other end of the single-pole single-throw switch 21 is connected to one end of the first resistive element 22. The other end of the first resistive element 22 is connected to the wiring 25.

The single-pole single-throw switch 21 operates with a voltage to be supplied to the wiring 23. The single-pole single-throw switch 21 electrically disconnects (off) the wiring 24 and the first resistive element 22 in a state in which the voltage is not supplied to the wiring 23. The single-pole single-throw switch 21 electrically connects (on) the wiring 24 and the first resistive element 22 in a state in which the voltage is supplied to the wiring 23.

In the coupled state in which the coupling device 20 couples the digital camera 10 and the accessory 30, and in a state in which the voltage is not supplied to the wiring 23, the single-pole single-throw switch 21 forms a first connection state in which the first resistive element 22 is not connected to the resistance detection terminal D2 of the digital camera 10 and the second resistive element 31 is connected in series to the resistance detection terminal D2.

In the above-described coupled state, and in a state in which the voltage is supplied to the wiring 23, the single-pole single-throw switch 21 forms a second connection state in which the first resistive element 22 and the second resistive element 31 are connected in parallel to the resistance detection terminal D2.

All of resistance values of the first resistive elements 22 embedded in all coupling devices 20 attachable to the digital camera 10 and resistance values of the second resistive elements 31 embedded in all accessories 30 attachable to the digital camera 10 or the coupling device 20 become different values.

The digital camera 10 comprises a power supply circuit 11, a switch 12 constituted of a switching element, such as a transistor, a resistance measurement unit 13, and the voltage supply terminal D1, the resistance detection terminal D2, and the ground terminal D3 that are provided for electrical connection to the coupling device 20 or the accessory 30.

The ground terminal D3 is electrically connected to the terminal J3 of the coupling device 20 in a state in which the coupling device 20 is attached to the digital camera 10. The ground terminal D3 is electrically connected to the terminal A3 of the accessory 30 in a state in which the accessory 30 is attached to the digital camera 10 without passing through the coupling device 20.

The power supply circuit 11 generates a power supply voltage needed for the operations of the digital camera 10 and the accessory 30.

The switch 12 is connected between the power supply circuit 11 and the voltage supply terminal D1, and is turned on and off under the control of the resistance measurement unit 13.

The voltage supply terminal D1 is a terminal that supplies a voltage needed for the operation of the accessory 30 to the accessory 30 electrically connectable to the digital camera 10.

The voltage supply terminal D1 functions as a terminal that outputs a control signal for controlling the single-pole single-throw switch 21 of the coupling device 20 in a state in which the coupling device 20 is attached to the digital camera 10. The control signal is a voltage that is generated in the power supply circuit 11 in the camera system 100.

The voltage supply terminal D1 is electrically connected to the terminal J1 of the coupling device 20 in a state in which the coupling device 20 is attached to the digital camera 10. The voltage supply terminal D1 is electrically connected to the terminal A1 of the accessory 30 in a state in which the accessory 30 is attached to the digital camera 10 without passing through the coupling device 20.

The resistance measurement unit 13 measures a resistance value of a resistive element that is electrically connected to the resistance detection terminal D2, and specifically, comprises a control circuit 13A, an identification resistive element 13C constituted of a resistor having a fixed resistance value, and an analog-to-digital converter 13B connected between the control circuit 13A and the resistance detection terminal D2.

One end of the identification resistive element 13C is connected to a power supply, to which a voltage VDD is supplied. The other end of the identification resistive element 13C is connected to a connection point of the resistance detection terminal D2 and the analog-to-digital converter 13B.

The resistance detection terminal D2 is electrically connected to the terminal J2 of the coupling device 20 in a state in which the coupling device 20 is attached to the digital camera 10. The resistance detection terminal D2 is electrically connected to the terminal A2 of the accessory 30 in a state in which the accessory 30 is attached to the digital camera 10 without passing through the coupling device 20.

The analog-to-digital converter 13B converts a voltage resistance-divided by the identification resistive element 13C and a resistive element (for example, one or both of the first resistive element 22 of the coupling device 20 and the second resistive element 31 of the accessory 30) connected to the resistance detection terminal D2 to a digital signal and outputs the digital signal to the control circuit 13A.

The control circuit 13A is primarily constituted of a processor, and includes a read only memory (ROM) in which programs to be executed by the processor, and the like are stored, a random access memory (RAM) as a work memory, and the like. The programs that are stored in the ROM include an operation program for the digital camera 10.

The control circuit 13A measures the resistance value of the resistive element electrically connected to the resistance detection terminal D2 when the processor executes the operation program. In the ROM of the control circuit 13A, a resistance value of the identification resistive element 13C is stored in advance. The control circuit 13A measures the resistance value of the resistive element electrically connected to the resistance detection terminal D2 based on the resistance value of the identification resistive element 13C and a voltage value output from the analog-to-digital converter 13B.

For example, in the above-described coupled state in which the coupling device 20 is attached to the digital camera 10 and the accessory 30 is attached to the coupling device 20, in a case where the single-pole single-throw switch 21 is turned off, a voltage divided by the identification resistive element 13C and the second resistive element 31 is detected by the analog-to-digital converter 13B, and a resistance value (first resistance value) of the second resistive element 31 is measured based on the detected voltage and the resistance value of the identification resistive element 13C by the control circuit 13A.

In a case where the single-pole single-throw switch 21 is turned on in the above-described coupled state, a voltage divided by the identification resistive element 13C, and the first resistive element 22 and the second resistive element 31 connected in parallel to the identification resistive element 13C is detected by the analog-to-digital converter 13B, and a combined resistance value (second resistance value) of the first resistive element 22 and the second resistive element 31 is measured based on the detected voltage and the resistance value of the identification resistive element 13C by the control circuit 13A. The combined resistance value is represented by Expression (1) described below in a case where a resistance value of the first resistive element 22 is Ra and the resistance value of the second resistive element 31 is Rb.

$$\text{combined resistance value} = 1/\{(1/Ra)+(1/Rb)\} \quad (1)$$

In the above-described coupled state, the control circuit 13A measures the combined resistance value of the first resistive element 22 and the second resistive element 31 after the resistance value of the second resistive element 31 is measured, and measures the resistance value of the first resistive element 22 based on the two resistance values from Expression (1).

In the ROM of the control circuit 13A, an accessory identification table in which, for each of a plurality of accessories 30 attachable to the digital camera 10 or the coupling device 20, the resistance value of the second resistive element 31 embedded in the accessory 30 and identification information of the accessory 30 are stored in association with each other is stored. In the ROM of the control circuit 13A, a coupling device identification table in which, for each of a plurality of coupling devices 20 attachable to the digital camera 10, the resistance value of the first resistive element 22 embedded in the coupling device 20 and identification information of the coupling device 20 are stored in association with each other is stored.

The control circuit 13A searches for the identification information corresponding to the resistance value measured in the above-described manner from the accessory identification table and the coupling device identification table stored in the ROM when the processor executes the operation program, thereby identifying the coupling device 20 and the accessory 30 that are electrically connected to the digital camera 10.

The control circuit 13A controls the on and off of the switch 12 when the processor executes the operation program.

The operation of the camera system 100 configured as above will be described. In the following description, it is assumed that there are an EVF, a first flash as a flash device, and a second flash as a flash device as the accessories 30 attachable to the digital camera 10, and there are a first adapter and a second adapter as the coupling devices 20 attachable to the digital camera 10.

Description will be provided assuming that, in the accessory identification table stored in the ROM of the control circuit 13A, a resistance value Ra1 is stored as a resistance value corresponding to identification information of the EVF, a resistance value Ra2 is stored as a resistance value corresponding to identification information of the first flash, and a resistance value Ra3 is stored as a resistance value corresponding to identification information of the second flash. Description will be provided assuming that, in the coupling device identification table stored in the ROM of the control circuit 13A, a resistance value Rb1 is stored as a resistance value corresponding to identification information of the first adapter, and a resistance value Rb2 is stored as a resistance value corresponding to identification information of the second adapter.

It is assumed that the EVF and the first flash operate with a voltage to be supplied from the digital camera 10, and the second flash operates with an embedded battery.

Figure 2:
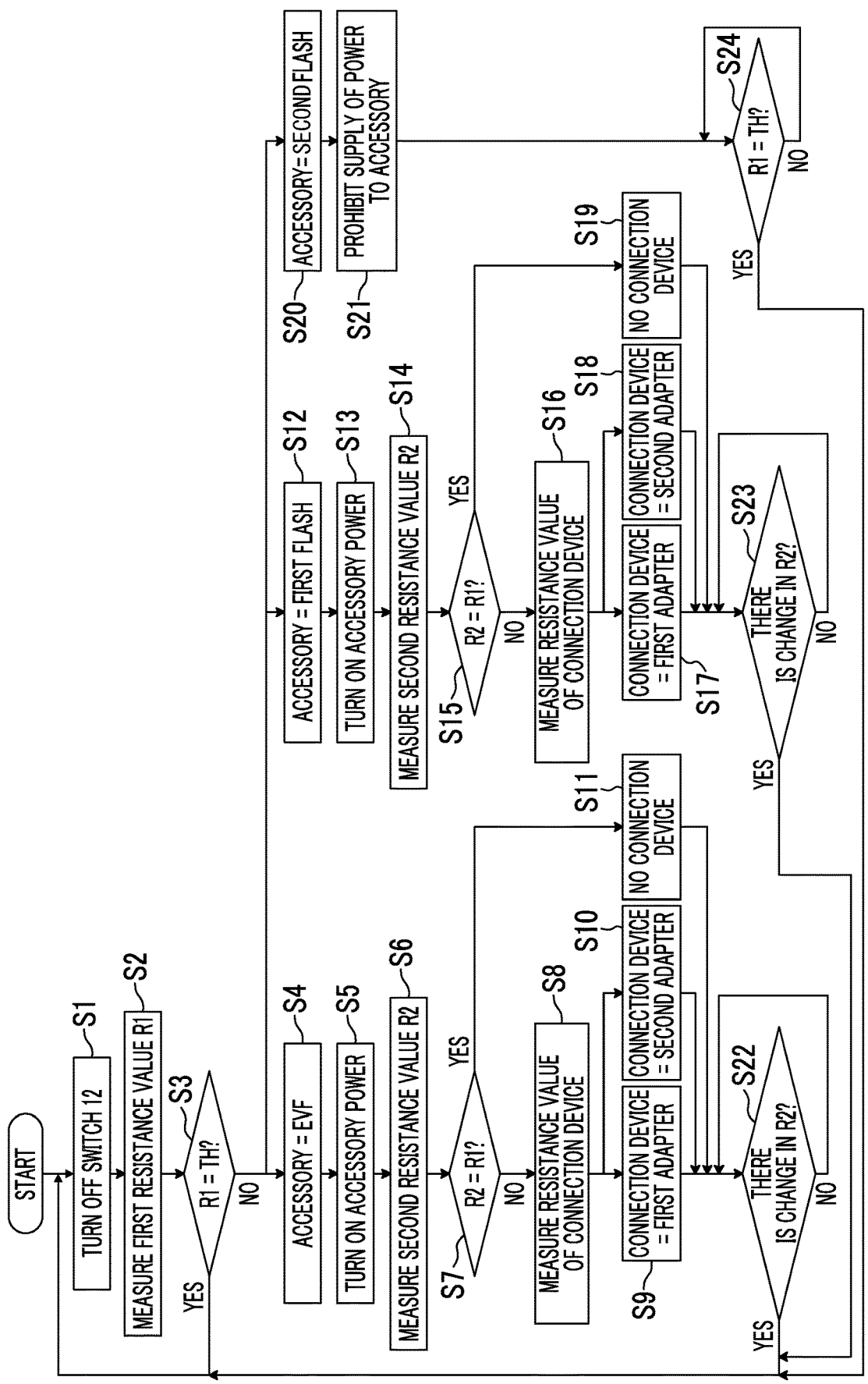
FIG. 2 is a flowchart illustrating the operation of the camera system 100 shown in FIG. 1.

FIG. 2 is a flowchart illustrating the operation of the camera system 100 shown in FIG. 1.

In a case where power is supplied to the digital camera 10, the control circuit 13A performs control such that the switch 12 of the digital camera 10 is turned off (Step S1). With this, a voltage is not output from the voltage supply terminal D1. Accordingly, in a case where the coupling device 20 is attached to the digital camera 10, a voltage is not supplied to the wiring 23 of the coupling device 20, and the single-pole single-throw switch 21 of the coupling device 20 is turned off.

Next, in a case where a voltage is detected by the analog-to-digital converter 13B in a state in which the switch 12 is turned off, the control circuit 13A measures a first resistance value R1 of a resistive element connected to the resistance detection terminal D2 based on the detected voltage and the resistance value of the identification resistive element 13C (Step S2). Step S2 constitutes a resistance measurement step.

In a case where the first resistance value R1 measured in Step S2 becomes a maximum value TH of a measurable resistance value (Step S3: YES), the control circuit 13A determines that the accessory 30 is not electrically connected to the digital camera 10, and returns the process to Step S1.

In a state where only the coupling device 20 is attached to the digital camera 10, since the resistance detection terminal D2 is opened, the first resistance value R1 measured by the control circuit 13A becomes the measurable maximum value TH. Accordingly, in such a case, determination is made that the accessory 30 is not attached.

In a case where the first resistance value R1 measured in Step S2 is less than the maximum value TH of the measurable resistance value (Step S3: NO), and in a case where the first resistance value R1 is the resistance value Ra1, the control circuit 13A identifies the accessory 30 as the EVF (Step S4). In a case where the first resistance value R1 is the resistance value Ra2, the control circuit 13A identifies the accessory 30 as the first flash (Step S12). In a case where the first resistance value R1 is the resistance value Ra3, the control circuit 13A identifies the accessory 30 as the second flash (Step S20).

In a case where the accessory 30 is identified as the EVF in Step S4, the control circuit 13A turns on the switch 12 to start to supply a voltage to the accessory 30 (in this case, the EVF) (Step S5).

Though the processing of Step S5, in a case where the coupling device 20 is attached to the digital camera 10, since a voltage is supplied to the wiring 23 of the coupling device 20, the single-pole single-throw switch 21 of the coupling device 20 is turned on.

After Step S5, the control circuit 13A measures a second resistance value R2 of the resistive elements connected to the resistance detection terminal D2 based on the voltage detected by the analog-to-digital converter 13B and the resistance value of the identification resistive element 13C (Step S6). Steps S5 and S6 constitute a resistance measurement step.

In a case where the coupling device 20 is attached to the digital camera 10 and the accessory 30 is attached to the coupling device 20, the combined resistance value of the first resistive element 22 and the second resistive element 31 is measured as the second resistance value R2 through the processing of Step S6.

In a case where the accessory 30 is attached to the digital camera 10 without passing through the coupling device 20, the resistance value (the same value as the first resistance value R1 measured in Step S1) of the second resistive element 31 is measured as the second resistance value R2 through the processing of Step S6.

Next, the control circuit 13A determines whether or not the second resistance value R2 coincides with the first resistance value R1 measured in Step S2 (Step S7).

In a case where the coupling device 20 is attached to the digital camera 10 and the accessory 30 is attached to the coupling device 20, the first resistance value R1 does not coincide with the second resistance value R2. In a case where the accessory 30 is attached to the digital camera 10 without passing through the coupling device 20, as described above, the first resistance value R1 coincides with the second resistance value R2.

Accordingly, in a case where the second resistance value R2 coincides with the first resistance value R1 (Step S7: YES), the control circuit 13A determines that the coupling device 20 is not attached (Step S11).

In a case where the second resistance value R2 does not coincide with the first resistance value R1 (Step S7: NO), the control circuit 13A determines that the coupling device 20 is attached, and measures the resistance value of the first resistive element 22 of the attached coupling device 20 based on the second resistance value R2 and the first resistance value R1 (Step S8). Step S8 constitutes a resistance measurement step.

In a case where the resistance value measured in Step S8 is the resistance value Rb1, the control circuit 13A identifies the attached coupling device 20 as the first adapter (Step S9).

In a case where the resistance value measured in Step S8 is the resistance value Rb2, the control circuit 13A identifies the attached coupling device 20 as the second adapter (Step S10).

In a case where the accessory 30 is identified as the first flash in Step S12, the control circuit 13A turns on the switch 12 to start to supply the voltage to the accessory 30 (in this case, the first flash) (Step S13).

After Step S13, the control circuit 13A measures the second resistance value R2 of the resistive elements connected to the resistance detection terminal D2 based on the voltage detected by the analog-to-digital converter 13B and the resistance value of the identification resistive element 13C (Step S14). Steps S13 and S14 constitute a resistance measurement step.

Next, the control circuit 13A determines whether or not the second resistance value R2 coincides with the first resistance value R1 measured in Step S2 (Step S15).

In a case where the second resistance value R2 coincides with the first resistance value R1 (Step S15: YES), the control circuit 13A determines that the coupling device 20 is not attached (Step S19).

In a case where the second resistance value R2 does not coincide with the first resistance value R1 (Step S15: NO), the control circuit 13A determines that the coupling device 20 is attached, and measures the resistance value of the first resistive element 22 of the attached coupling device 20 based on the second resistance value R2 and the first resistance value R1 (Step S16). Step S16 constitutes a resistance measurement step.

In a case where the resistance value measured in Step S16 is the resistance value Rb1, the control circuit 13A identifies the attached coupling device 20 as the first adapter (Step S17).

In a case where the resistance value measured in the Step S16 is the resistance value Rb2, the control circuit 13A identifies the attached coupling device 20 as the second adapter (Step S18).

In a case where the accessory 30 is identified as the second flash in Step S20, the control circuit 13A does not turn on the switch 12 to prohibit to supply the voltage to the accessory 30 (in this case, the second flash) (Step S21).

After the processing of Steps S9, S10, and S11, the control circuit 13A measures the resistance value of the resistive element connected to the resistance detection terminal D2 at regular intervals while maintaining the switch 12 to be turned on, in a case where the measured resistance value does not coincide with the second resistance value R2 measured in Step S6 (Step S22: YES), determines that the accessory 30 is detached from the digital camera 10 or the coupling device 20, and returns the process to Step S1.

After the processing of Steps S17, S18, and S19, the control circuit 13A measures the resistance value of the resistive element connected to the resistance detection terminal D2 at regular intervals while maintaining the switch 12 to be turned on, in a case where the measured resistance value does not coincide with the second resistance value R2 measured in Step S14 (Step S23: YES), determines that the accessory 30 is detached from the digital camera 10 or the coupling device 20, and returns the process to Step S1.

After the processing of Step S21, the control circuit 13A measures the resistance value of the resistive element connected to the resistance detection terminal D2 at regular intervals while maintaining the switch 12 to be turned off, in a case where the measured resistance value becomes the maximum value TH, determines that the accessory 30 is detached from the digital camera 10 or the coupling device 20, and returns the process to Step S1.

Through the processing of Step S9, S10, S11, S17, S18, or S19, in a case where the accessory 30 is attached to the digital camera 10 through the coupling device 20, the control circuit 13A starts control corresponding to the combination of the coupling device 20 and the accessory 30. In a case where the accessory 30 is attached to the digital camera 10 without passing through the coupling device 20, the control circuit 13A starts control corresponding to the type of the accessory 30 in a case where there is no coupling device 20. The control circuit 13A starts control corresponding to the type of the accessory 30 through the processing of Step S20.

As described above, with the camera system 100, the accessory 30 is identified based on the first resistance value R1 measured in a state in which the switch 12 of the digital camera 10 is turned off, and the presence or absence of attachment of the coupling device 20 is determined and the coupling device 20 is identified based on the second resistance value R2 and the first resistance value R1 measured in a state in which the single-pole single-throw switch 21 is turned on after the accessory 30 is identified.

In this way, since it is possible to individually measure the resistance value of the coupling device 20 and the resistance value of the accessory 30, it is possible to increase the types of the coupling devices 20 and the accessories 30, and to increase expandability of the functions of the digital camera 10.

With the camera system 100, since the coupling device 20 and the accessory 30 may not be embedded with expensive and large circuits, such as microcomputers, it is possible to achieve reduction in cost and size of the coupling device 20 and the accessory 30.

With the camera system 100, the single-pole single-throw switch 21 of the coupling device 20 is controlled with a voltage to be supplied to the voltage supply terminal D1 provided to supply a voltage to the accessory 30. For this reason, there is no need to add, to the digital camera 10, a dedicated terminal that outputs a control signal for controlling the single-pole single-throw switch 21 of the coupling device 20, and it is possible to reduce the manufacturing cost of the digital camera 10. It is possible to perform voltage supply processing to the accessory 30 and switching processing of the single-pole single-throw switch 21 simultaneously, and to increase the processing efficiency of the system.

The terminal on the digital camera 10 side to be connected to the terminal J1 of the coupling device 20 in the digital camera 10 may be a terminal other than the voltage supply terminal D1.

Figure 3:
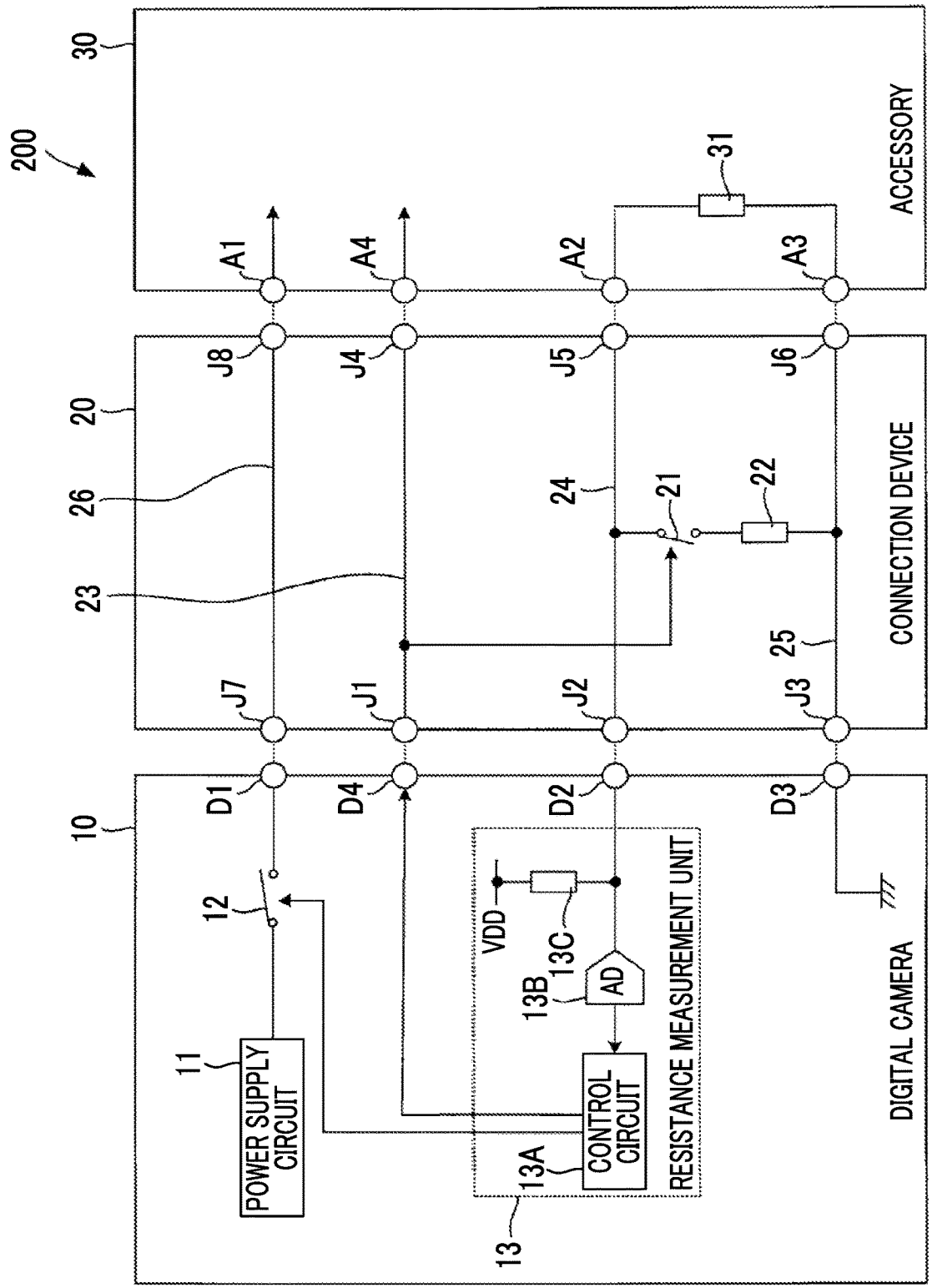
FIG. 3 is a schematic view showing the schematic configuration of a camera system 200 that is a modification example of the camera system 100 shown in FIG. 1.

FIG. 3 is a schematic view showing the schematic configuration of a camera system 200 that is a modification example of the camera system 100 shown in FIG. 1. In FIG. 3, the same configurations as those in FIG. 1 are represented by the same reference numerals.

The camera system 200 has a configuration in which, compared to the camera system 100, a communication terminal D4 provided to perform communication with the accessory 30 is added to the digital camera 10, a terminal J7, a terminal J8, and a wiring 26 connecting the terminal J7 and the terminal J8 are added to the coupling device 20, and a communication terminal A4 provided to perform communication with the digital camera 10 is added to the accessory 30.

In the camera system 200, in a case where the coupling device 20 is attached to the digital camera 10, the terminal J7 of the coupling device 20 is connected to the voltage supply terminal D1 of the digital camera 10, and the terminal J1 of the coupling device 20 is connected to the communication terminal D4 of the digital camera 10.

In the camera system 200, in a state in which the accessory 30 is attached to the coupling device 20, the terminal A1 of the accessory 30 is connected to the terminal J8 of the coupling device 20, and the communication terminal A4 of the accessory 30 is connected to the terminal J4 of the coupling device 20.

The control circuit 13A in the digital camera 10 of the camera system 200 performs control on the switch 12 in the same manner as in the camera system 100, outputs a control signal for turning off the single-pole single-throw switch 21 from the communication terminal D4 in a state in which the switch 12 is controlled to be turned off, and outputs a control signal for turning on the single-pole single-throw switch 21 from the communication terminal D4 in a state in which the switch 12 is controlled to be turned on. The communication terminal D4 constitutes a terminal that outputs a control signal.

Even in the camera system 200 described above, as in the camera system 100, it is possible to identify the coupling device 20 and the accessory 30 with the digital camera 10. Since the digital camera 10 performs control on the single-pole single-throw switch 21 using the communication terminal D4 provided to perform communication with the accessory 30, it is possible to restrain an increase in the number of terminals to reduce manufacturing cost.

Figure 4:
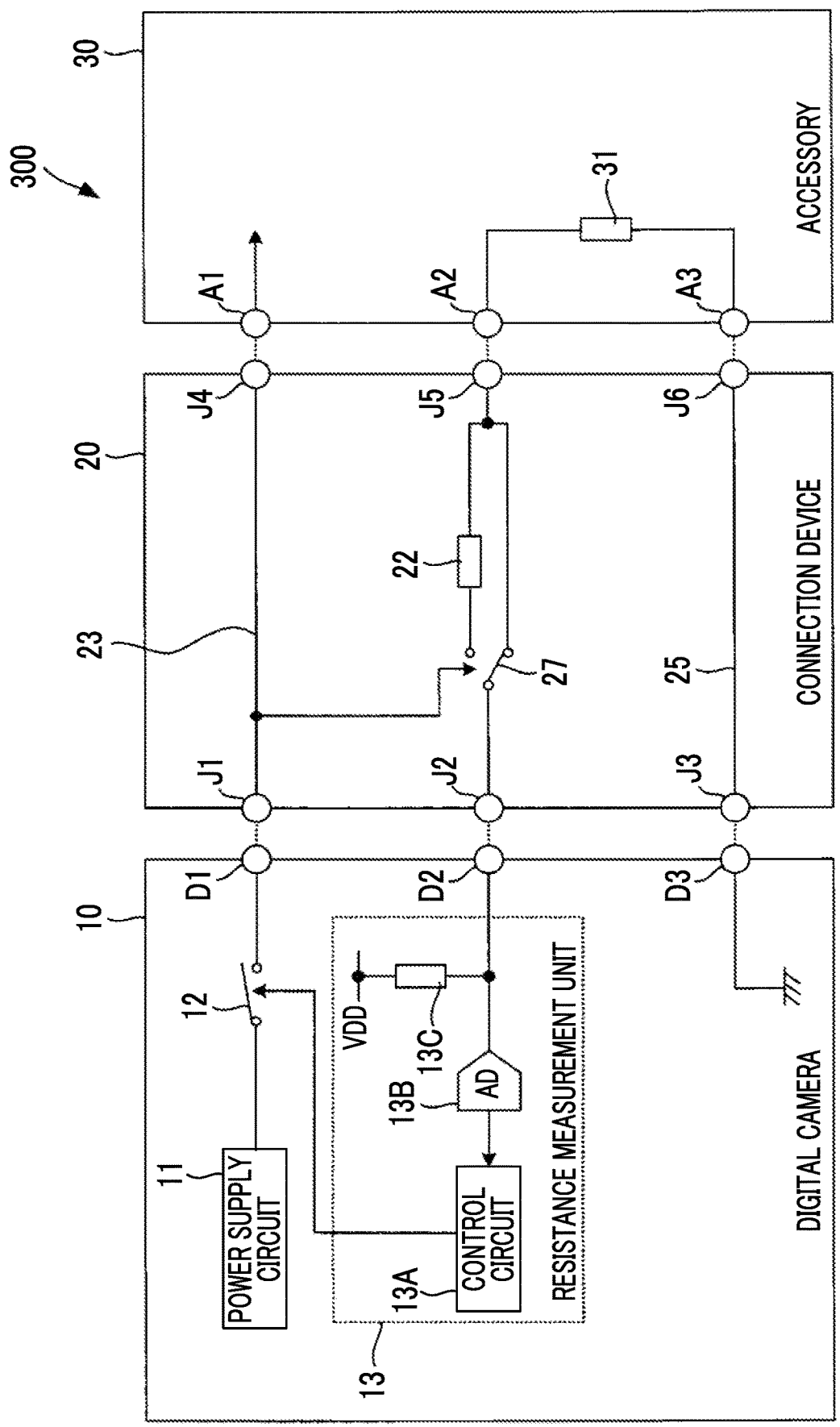
FIG. 4 is a schematic view showing the schematic configuration of a camera system 300 that is another modification example of the camera system 100 shown in FIG. 1.

FIG. 4 is a schematic view showing the schematic configuration of a camera system 300 that is another modification example of the camera system 100 shown in FIG. 1. In FIG. 4, the same configurations as those in FIG. 1 are represented by the same reference numerals.

The camera system 300 has the same configuration as the camera system 100 excluding that the single-pole single-throw switch 21 of the coupling device 20 is changed to a single-pole double-throw switch 27, a first resistive element 22 is connected between one contact of the single-pole double-throw switch 27 and the terminal J5, and the other contact of the single-pole double-throw switch 27 is connected to the terminal J5.

In the above-described coupled state, in a state in which the voltage is not supplied to the wiring 23, the single-pole double-throw switch 27 connects the terminal J2 and the terminal J5 without passing through the first resistive element 22 to form the first connection state in which the first resistive element 22 is not connected to the resistance detection terminal D2 and the second resistive element 31 is connected to the resistance detection terminal D2.

In the above-described coupled state, in a state in which the voltage is supplied to the wiring 23, the single-pole double-throw switch 27 connects the terminal J2 and the terminal J5 through the first resistive element 22 to form the second connection state in which the first resistive element 22 and the second resistive element 31 are connected to the resistance detection terminal D2.

With the camera system 300, the resistance measurement unit 13 measures the resistance value of the second resistive element 31 in the first connection state, and then, measures the resistance value of the first resistive element 22 in the second connection state, whereby it is possible to accurately identify the coupling device 20 and the accessory 30. The single-pole single-throw switch 21 in the coupling device 20 of the camera system 100 shown in FIG. 1 is manufactured more simply than the single-pole double-throw switch 27. For this reason, the camera system 100 of FIG. 1 can achieve reduction in manufacturing cost and size of the coupling device 20 compared to the camera system 300.

In the above-described embodiment, although the digital camera 10 with the attachable and detachable coupling device 20 has been described as an example, the invention can be applied similarly to an information device, such as a smartphone, other than the digital camera as long as the same coupling device as the coupling device 20 is attachable and detachable.

As described above, the following matters are disclosed in the specification.

(1) A coupling device that couples an information device and an accessory of the information device to electrically connect the information device and the accessory, the coupling device comprising a first resistive element, and a switching element that is controlled by the information device to, in a coupled state in which the information device is coupled to the accessory, switch an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal.

(2) The coupling device described in (1), further comprising a wiring that provides electrical conduction between a voltage supply terminal provided in the information device for supplying a voltage needed for an operation of the accessory and a terminal of the accessory in the coupled state, in which the switching element switches the connection state based on the voltage supplied to the wiring.

(3) The coupling device described in (2), in which the switching element brings the connection state into the first connection state in a state in which the voltage is not supplied to the wiring and brings the connection state into the second connection state in a state in which the voltage is supplied to the wiring.

(4) The coupling device described in any one of (1) to (3), in which a combined resistance value of the first resistive element and the second resistive element is measured by the information device in the second connection state after a resistance value of the second resistive element is measured by the information device in the first connection state, and a resistance value of the first resistive element is measured based on the combined resistance value and the resistance value of the second resistive element.

(5) The coupling device described in any one of (1) to (4), in which the switching element is a single-pole single-throw switch, in the second connection state, the first resistive element and the second resistive element are connected in parallel to the resistance detection terminal, and in the first connection state, the second resistive element is connected in series to the resistance detection terminal.

(6) An information device, to which a coupling device with an attachable and detachable accessory is attachable and which is electrically connected to the accessory attached to the coupling device through the coupling device, in which the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises the resistance detection terminal, a terminal that outputs a control signal for controlling the switching element of the coupling device, and a resistance measurement unit that measures a resistance value of a resistive element electrically connected to the resistance detection terminal, and the resistance measurement unit supplies the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measures a resistance value of the first resistive element based on the first resistance value and the second resistance value.

(7) The information device described in (6), in which the terminal is a voltage supply terminal for supplying a voltage needed for an operation of the accessory, the coupling device includes a wiring that provides electrical conduction between the voltage supply terminal and a terminal of the accessory, the switching element bring the connection state into the first connection state in a state in which the voltage is not supplied to the wiring and brings the connection state into the second connection state in a state in which the voltage is supplied to the wiring, and the resistance measurement unit measures the first resistance value in a state in which the voltage is not supplied to the voltage supply terminal and supplies the voltage to the voltage supply terminal after the first resistance value is measured.

(8) An information system comprising a coupling device with an attachable and detachable accessory, and an information device to which the coupling device is attachable and that is electrically connected to the accessory attached to the coupling device through the coupling device, in which the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises the resistance detection terminal, a terminal that outputs a control signal for controlling the switching element, and a resistance measurement unit that measures a resistance value of a resistive element electrically connected to the resistance detection terminal, and the resistance measurement unit supplies the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measures a resistance value of the first resistive element based on the first resistance value and the second resistance value.

(9) The information system described in (8), in which the coupling device further includes a wiring that provides electrical conduction between the terminal provided in the information device for supplying a voltage needed for an operation of the accessory and a terminal of the accessory in the coupled state, and the switching element switches the connection state based on the voltage supplied to the wiring.

(10) The information system described in (9), in which the switching element brings the connection state into the first connection state in a state in which the voltage is not supplied to the wiring and brings the connection state into the second connection state in a state in which the voltage is supplied to the wiring.

(11) The information system described in (10), in which the resistance measurement unit measures the first resistance value in a state in which the voltage is not supplied to the terminal of the information device and supplies the voltage to the terminal after the first resistance value is measured.

(12) A method of operating an information device, to which a coupling device with an attachable and detachable accessory is attachable and which is electrically connected to the accessory attached to the coupling device through the coupling device, in which the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises the resistance detection terminal, and a terminal that outputs a control signal for controlling the switching element of the coupling device, and the method comprises a resistance measurement step of supplying the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measuring a resistance value of the first resistive element based on the first resistance value and the second resistance value.

(13) The method described in (12), in which the terminal is a voltage supply terminal for supplying a voltage needed for an operation of the accessory, the coupling device includes a wiring that provides electrical conduction between the voltage supply terminal and a terminal of the accessory, the switching element bring the connection state into the first connection state in a state in which the voltage is not supplied to the wiring and brings the connection state into the second connection state in a state in which the voltage is supplied to the wiring, and in the resistance measurement step, the first resistance value is measured in a state in which the voltage is not supplied to the voltage supply terminal, and the voltage is supplied to the voltage supply terminal after the first resistance value is measured.

(14) An operation program for an information device, to which a coupling device with an attachable and detachable accessory is attachable and which is electrically connected to the accessory attached to the coupling device through the coupling device, in which the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises the resistance detection terminal, and a terminal that outputs a control signal for controlling the switching element of the coupling device, and the operation program causes a computer to execute a resistance measurement step of supplying the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measuring a resistance value of the first resistive element based on the first resistance value and the second resistance value.

According to the invention, it is possible to provide an information device capable of accurately determining the type of an accessory attached to the information device and the type of a coupling device coupling the accessory and the information device without degrading expandability of the information device, a coupling device attachable to the information device, an information system including the information device and the coupling device, a method of operating an information device, and an operation program for an information device.

EXPLANATION OF REFERENCES 100, 200, 300: camera system
10: digital camera
11: power supply circuit
12: switch
13: resistance measurement unit
13A: control circuit
13B: analog-to-digital converter
13C: identification resistive element
D1: voltage supply terminal
D2: resistance detection terminal
D3: ground terminal
D4: communication terminal
20: coupling device
21: single-pole single-throw switch
22: first resistive element
23, 24, 25, 26: wiring
27: single-pole double-throw switch
J1 to J8: terminal
30: accessory
31: second resistive element
A1 to A3: terminal
A4: communication terminal

What is claimed is:

1. A coupling device that couples an information device and an accessory of the information device to electrically connect the information device and the accessory, the coupling device comprising:
a first resistive element; and
a switching element that is controlled by the information device to, in a coupled state in which the information device is coupled to the accessory, switch an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal.

2. The coupling device according to claim 1, further comprising:
a wiring that provides electrical conduction between a voltage supply terminal provided in the information device for supplying a voltage needed for an operation of the accessory and a terminal of the accessory in the coupled state,
wherein the switching element switches the connection state based on the voltage supplied to the wiring.

3. The coupling device according to claim 2,
wherein the switching element brings the connection state into the first connection state in a state in which the voltage is not supplied to the wiring and brings the connection state into the second connection state in a state in which the voltage is supplied to the wiring.

4. The coupling device according to claim 3,
wherein a combined resistance value of the first resistive element and the second resistive element is measured by the information device in the second connection state after a resistance value of the second resistive element is measured by the information device in the first connection state, and a resistance value of the first resistive element is measured based on the combined resistance value and the resistance value of the second resistive element.

5. The coupling device according to claim 3,
wherein the switching element is a single-pole single-throw switch, in the second connection state, the first resistive element and the second resistive element are connected in parallel to the resistance detection terminal, and in the first connection state, the second resistive element is connected in series to the resistance detection terminal.

6. The coupling device according to claim 2, wherein a combined resistance value of the first resistive element and the second resistive element is measured by the information device in the second connection state after a resistance value of the second resistive element is measured by the information device in the first connection state, and a resistance value of the first resistive element is measured based on the combined resistance value and the resistance value of the second resistive element.

7. The coupling device according to claim 2, wherein the switching element is a single-pole single-throw switch, in the second connection state, the first resistive element and the second resistive element are connected in parallel to the resistance detection terminal, and in the first connection state, the second resistive element is connected in series to the resistance detection terminal.

8. The coupling device according to claim 1, wherein a combined resistance value of the first resistive element and the second resistive element is measured by the information device in the second connection state after a resistance value of the second resistive element is measured by the information device in the first connection state, and a resistance value of the first resistive element is measured based on the combined resistance value and the resistance value of the second resistive element.

9. The coupling device according to claim 8, wherein the switching element is a single-pole single-throw switch, in the second connection state, the first resistive element and the second resistive element are connected in parallel to the resistance detection terminal, and in the first connection state, the second resistive element is connected in series to the resistance detection terminal.

10. The coupling device according to claim 1, wherein the switching element is a single-pole single-throw switch, in the second connection state, the first resistive element and the second resistive element are connected in parallel to the resistance detection terminal, and in the first connection state, the second resistive element is connected in series to the resistance detection terminal.

11. An information device, to which a coupling device with an attachable and detachable accessory is attachable and which is electrically connected to the accessory attached to the coupling device through the coupling device, wherein the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises:

the resistance detection terminal;

a terminal that outputs a control signal for controlling the switching element of the coupling device; and a resistance measurement unit that measures a resistance value of a resistive element electrically connected to the resistance detection terminal, and the resistance measurement unit supplies the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measures a resistance value of the first resistive element based on the first resistance value and the second resistance value.

12. The information device according to claim 11, wherein the terminal is a voltage supply terminal for supplying a voltage needed for an operation of the accessory, the coupling device includes a wiring that provides electrical conduction between the voltage supply terminal and a terminal of the accessory, the switching element bring the connection state into the first connection state in a state in which the voltage is not supplied to the wiring and brings the connection state into the second connection state in a state in which the voltage is supplied to the wiring, and the resistance measurement unit measures the first resistance value in a state in which the voltage is not supplied to the voltage supply terminal and supplies the voltage to the voltage supply terminal after the first resistance value is measured.

13. An information system comprising:

a coupling device with an attachable and detachable accessory; and an information device to which the coupling device is attachable and that is electrically connected to the accessory attached to the coupling device through the coupling device, wherein the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises the resistance detection terminal, a terminal that outputs a control signal for controlling the switching element, and a resistance measurement unit that measures a resistance value of a resistive element electrically connected to the resistance detection terminal, and the resistance measurement unit supplies the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measures a resistance value of the first resistive element based on the first resistance value and the second resistance value.

14. The information system according to claim 13, wherein the coupling device further includes a wiring that provides electrical conduction between the terminal provided in the information device for supplying a voltage needed for an operation of the accessory and a terminal of the accessory in the coupled state, and the switching element switches the connection state based on the voltage supplied to the wiring.

15. The information system according to claim 14, wherein the switching element brings the connection state into the first connection state in a state in which the voltage is not supplied to the wiring and brings the connection state into the second connection state in a state in which the voltage is supplied to the wiring.

16. The information system according to claim 15, wherein the resistance measurement unit measures the first resistance value in a state in which the voltage is not supplied to the terminal of the information device and supplies the voltage to the terminal after the first resistance value is measured.

17. A method of operating an information device, to which a coupling device with an attachable and detachable accessory is attachable and which is electrically connected to the accessory attached to the coupling device through the coupling device, wherein the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, and the information device comprises the resistance detection terminal, and a terminal that outputs a control signal for controlling the switching element of the coupling device, the method comprising:

a resistance measurement step of supplying the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measuring a resistance value of the first resistive element based on the first resistance value and the second resistance value.

18. The method according to claim 17, wherein the terminal is a voltage supply terminal for supplying a voltage needed for an operation of the accessory, the coupling device includes a wiring that provides electrical conduction between the voltage supply terminal and a terminal of the accessory, the switching element bring the connection state into the first connection state in a state in which the voltage is not supplied to the wiring and brings the connection state into the second connection state in a state in which the voltage is supplied to the wiring, and in the resistance measurement step, the first resistance value is measured in a state in which the voltage is not supplied to the voltage supply terminal, and the voltage is supplied to the voltage supply terminal after the first resistance value is measured.

19. A non-transitory computer readable recording medium storing an operation program for an information device, to which a coupling device with an attachable and detachable accessory is attachable and which is electrically connected to the accessory attached to the coupling device through the coupling device, wherein the coupling device includes a first resistive element, and a switching element that, in a coupled state in which the information device is coupled to the accessory, switches an electrical connection state of the first resistive element and a second resistive element included in the accessory to a resistance detection terminal of the information device between a first connection state in which the first resistive element is not connected to the resistance detection terminal and the second resistive element is connected to the resistance detection terminal and a second connection state in which the first resistive element and the second resistive element are connected to the resistance detection terminal, the information device comprises the resistance detection terminal, and a terminal that outputs a control signal for controlling the switching element of the coupling device, and the operation program causes a computer to execute:

a resistance measurement step of supplying the control signal for controlling the connection state to the second connection state to the terminal to measure a second resistance value of the resistive element electrically connected to the resistance detection terminal after a first resistance value of the resistive element electrically connected to the resistance detection terminal is measured in a state in which the control signal for controlling the connection state to the first connection state is supplied to the terminal, and measuring a resistance value of the first resistive element based on the first resistance value and the second resistance value.

* * * * *